(12) United States Patent
Hughes et al.

(10) Patent No.: US 10,861,433 B1
(45) Date of Patent: Dec. 8, 2020

(54) QUANTIZER

(71) Applicant: Dialog Semiconductor B.V., s-Hertogenbosch (NL)

(72) Inventors: Ashley Hughes, Edinburgh (GB); Wessel Harm Lubberhuizen, Delden (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/407,242

(22) Filed: May 9, 2019

(51) Int. Cl.
*H03M 3/00* (2006.01)
*G10K 11/178* (2006.01)

(52) U.S. Cl.
CPC ......... *G10K 11/1785* (2018.01); *H03M 3/422* (2013.01); *H03M 3/438* (2013.01); *G10K 2210/1081* (2013.01)

(58) Field of Classification Search
CPC ...... H03M 3/422; H03M 3/434; H03M 3/424; H03M 3/428; H03M 3/39
See application file for complete search history.

(56) References Cited

U.S. PATENT DOCUMENTS

| | | | |
|---|---|---|---|
| 3,793,513 | A | 2/1974 | Kaneko |
| 5,262,972 | A | 11/1993 | Holden et al. |
| 5,301,134 | A | 4/1994 | Maruyama |
| 5,305,307 | A | 4/1994 | Chu |
| 5,757,862 | A | 5/1998 | Ishizu |
| 5,946,650 | A | 8/1999 | Wei |
| 7,058,190 | B1 | 6/2006 | Zakarauskas |
| 7,636,747 | B2 | 12/2009 | Watanabe |
| 7,652,604 | B2 | 1/2010 | Parayandeh et al. |
| 7,696,913 | B2 | 4/2010 | Melanson |
| 7,756,222 | B2 | 7/2010 | Chen |
| 8,467,483 | B2 | 6/2013 | Vishakhadatta |
| 8,644,523 | B2 | 2/2014 | Clemow |

(Continued)

FOREIGN PATENT DOCUMENTS

| | | |
|---|---|---|
| EP | 2 860 874 | 12/2016 |
| GB | 2541977 | 3/2017 |
| WO | WO 2017/190976 | 11/2017 |

OTHER PUBLICATIONS

D.A. Johns et al., "Sigma-delta based IIR filters," [1991] Proceedings of the 34th Midwest Symposium on Circuits and Systems, Monterey, CA, USA, May 1992, pp. 210-213, vol. 1.

(Continued)

*Primary Examiner* — Kile O Blair
(74) *Attorney, Agent, or Firm* — Saile Ackerman LLC; Stephen B. Ackerman

(57) ABSTRACT

A quantizer and a method for a sigma-delta modulator circuit that may be used as a component within an adaptive-noise cancelling headphone are presented. An apparatus includes a quantizer to receive an input signal with successive input values and quantizes the input signal at discrete intervals. This is done by mapping the input value of the input signal at each interval to one of a plurality of quantization levels with three or more quantization levels that are non-uniformly spaced. The plurality of quantization levels has a first portion with two or more quantization levels having the same sign and being proportional to a first fraction having one as its numerator and two to a power of a first variable as its denominator, the first variable being an integer and having a different value for each of the two or more quantization levels of the first portion.

22 Claims, 9 Drawing Sheets

(56) References Cited

U.S. PATENT DOCUMENTS

| | | | |
|---|---|---|---|
| 8,737,636 | B2 | 5/2014 | Park et al. |
| 8,896,738 | B2 | 11/2014 | Sato et al. |
| 9,053,697 | B2 | 6/2015 | Park et al. |
| 9,065,471 | B1 | 6/2015 | Okuda |
| 9,209,828 | B2 | 12/2015 | Schubert et al. |
| 9,361,872 | B2 | 6/2016 | Park et al. |
| 9,584,146 | B2 | 2/2017 | Op 't Eynde et al. |
| 9,644,561 | B2 | 5/2017 | Magner |
| 9,659,558 | B2 | 5/2017 | Park et al. |
| 9,857,921 | B2 | 1/2018 | Pant |
| 10,236,905 | B1 | 3/2019 | Callanan et al. |
| 2005/0008071 | A1 | 1/2005 | Bose et al. |
| 2005/0053227 | A1 | 3/2005 | Fortier |
| 2007/0188218 | A1 | 8/2007 | Ueda |
| 2007/0273446 | A1 | 11/2007 | Kim |
| 2007/0285160 | A1 | 12/2007 | Kim |
| 2008/0225168 | A1 | 9/2008 | Duslis |
| 2010/0318205 | A1 | 12/2010 | Ohkuri |
| 2011/0007907 | A1 | 1/2011 | Park et al. |
| 2012/0148074 | A1 | 6/2012 | Bastiaens |
| 2014/0112492 | A1 | 4/2014 | Clemow |
| 2014/0125504 | A1 | 5/2014 | Braswell |
| 2014/0333462 | A1 | 11/2014 | Breems |
| 2016/0173112 | A1 | 6/2016 | Das |

OTHER PUBLICATIONS

D. A. Johns et al., "Design and analysis of delta-sigma based IIR filters," IEEE Transactions on Circuits and Systems II: Analog and Digital Signal, Processing, vol. 40, Issue: 4, Apr. 1993, pp. 233-240.

D. A. Johns et al., "IIR filtering on sigma-delta modulated signals," Electronics Letters, Feb. 14, 1991, vol. 27, No. 4, pp. 307-308.

D. A. Johns, "Analog and Digital State-Space Adaptive IIR Filters", PhD Thesis, Mar. 1989, 153 pages.

D. A. Johns et al., "Adaptive Recursive State-Space Filters Using a Gradient-Based Algorithm," IEEE Transactions on Circuits and Systems, vol. 37, Issue: 6, Jun. 1990, pp. 673-684.

P. W. Wong et al., "FIR Filters with Sigma-Delta Modulation Encoding," IEEE Transactions on Acoustics, Speech, and Signal Processing, vol. 38, Issue: 6, Jun. 1990, pp. 979-990.

Horst Gether et al., A perspective on digital ANC solutions in a low latency dominated world, EDN, Jun. 19, 2017, https://www.edn.com/design/analog/4458544/A-perspective-on-digital-ANC-solutions-in-a-low-latency-dominated-world.

M. A. Aldajani et al., "Stability analysis of an adaptive structure for sigma delta modulation," ICECS 2000. 7th IEEE International Conference on Electronics, Circuits and Systems (Cat. No. 00EX445), Dec. 2000, pp. 129-132, vol. 1.

M. A. Aldajani et al., "Stability and Performance Analysis of an Adaptive Sigma-Delta Modulator," IEEE Transactions on Circuits and Systems II: Analog and Digital Signal Processing, vol. 48, No. 3, Mar. 2001, pp. 233-244.

Robert Bristow-Johnson, DSP Trick: Fixed-Point DC Blocking Filter With Noise-Shaping, dspGuru by Iowegian International, Apr. 17, 2011, https://dspguru.com/dsp/tricks/fixed-point-dc-blocking-filter-with-noise-shaping/, accessed on Apr. 18, 2019, 2 pages.

Richard G. Lyons, DSP Tricks: DC Removal, Embedded, Aug. 11, 2008, https://www.embedded.com/design/configurable-systems/4007653/DSP-Tricks-DC-Removal, accessed on Apr. 18, 2019, pp. 1-5.

Richard G. Lyons, Understanding digital signal processing, Second Edition, Prentice Hall PTR, 2004, chapter 13, pp. 84-87.

Ali Grami, Introduction to Digital Communications, Elsevier, 2016, chapter 5, pp. 217-264.

A query on the non-uniform Quantization, Stack Exchange, 2017, https://dsp.stackexchange.com/questions/40137/a-query-on-the-non-uniform-quantization, accessed on Apr. 18, 2019.

Jon Dattorro, The Implementation of Recursive Digital Filters for High-Fidelity Audio, Journal of Audio Engineering Society, Nov. 1988, vol. 36, No. 11, pp. 851-878 and Letters to the Editor.

Thomas Kite, Understanding PDM Digital Audio, Audio Precision Inc., 2012, http://users.ece.utexas.edu/~bevans/courses/rtdsp/lectures/10 Data Conversion/AP Understanding PDM Digital Audio.pdr, accessed on Apr. 18, 2019, pp. 1-9.

Xilinx, CIC, Aug. 2007, https://www.mit.bme.hu/systems/files/oktatas/targyak/8498/CIC_ppt.pdf, accessed in Apr. 18, 2019, 45 pages.

Alan V. Oppenheim et al., "Discrete-Time Signal Processing", 2010 Pearson, p. 412.

Wikipedia, Super Audio CD, Graph / https://en.wikipedia.org/wiki/Pulse-code_ modulation / CC BY-SA 3.0—Google S . . . found Jun. 12, 2019, pp. 1-4.

U.S. Notice of Allowance, U.S. Appl. No. 16/407,227, dated May 9, 2019, dated Jan. 21, 2020, 13 pages.

U.S. Notice of Allowance, U.S. Appl. No. 16/407,247, dated May 9, 2019, dated Jan. 17, 2020, 12 pages.

U.S. Office Action, U.S. Appl. No. 16/407,250, dated May 9,2019, dated Feb. 4, 2020, 14 pages.

Notice of Allowance, U.S. Appl. No. 16/407,227, dated Apr. 20, 10 pages.

U.S. Office Action, U.S. Appl. No. 16/407,232, dated Jun. 9, 2020, 25 pages.

U.S. Notice of Allowance, U.S. Appl. No. 16/407,227, dated Jun. 5, 2020, 11 pages.

U.S. Notice of Allowance, U.S. Appl. No. 16/407,250, dated Jun. 2, 2020, 9 pages.

U.S. Notice of Allowance, U.S. Appl. No. 16/407,247, dated Jun. 15, 2020, 9 pages.

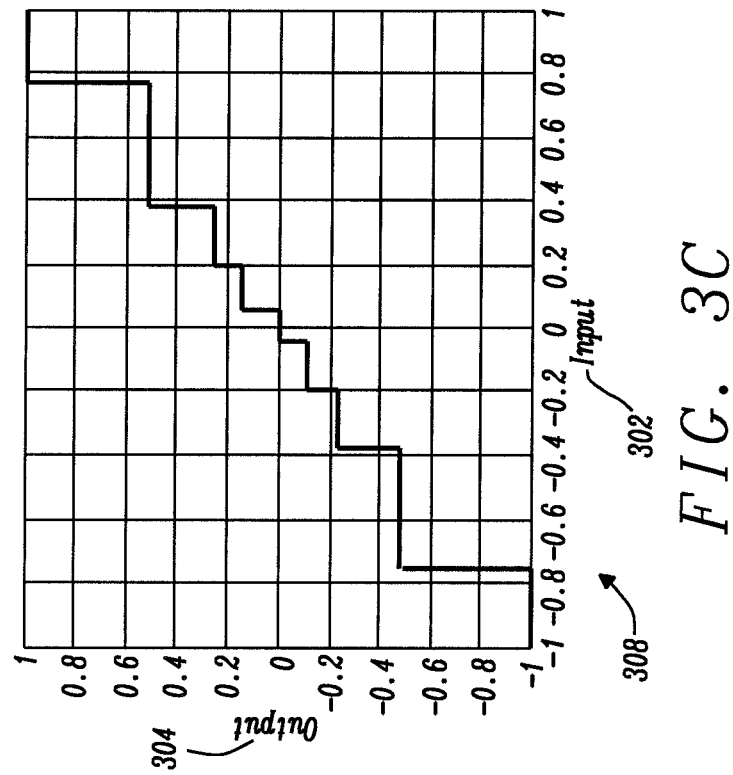
*FIG. 3C*
*FIG. 3A*
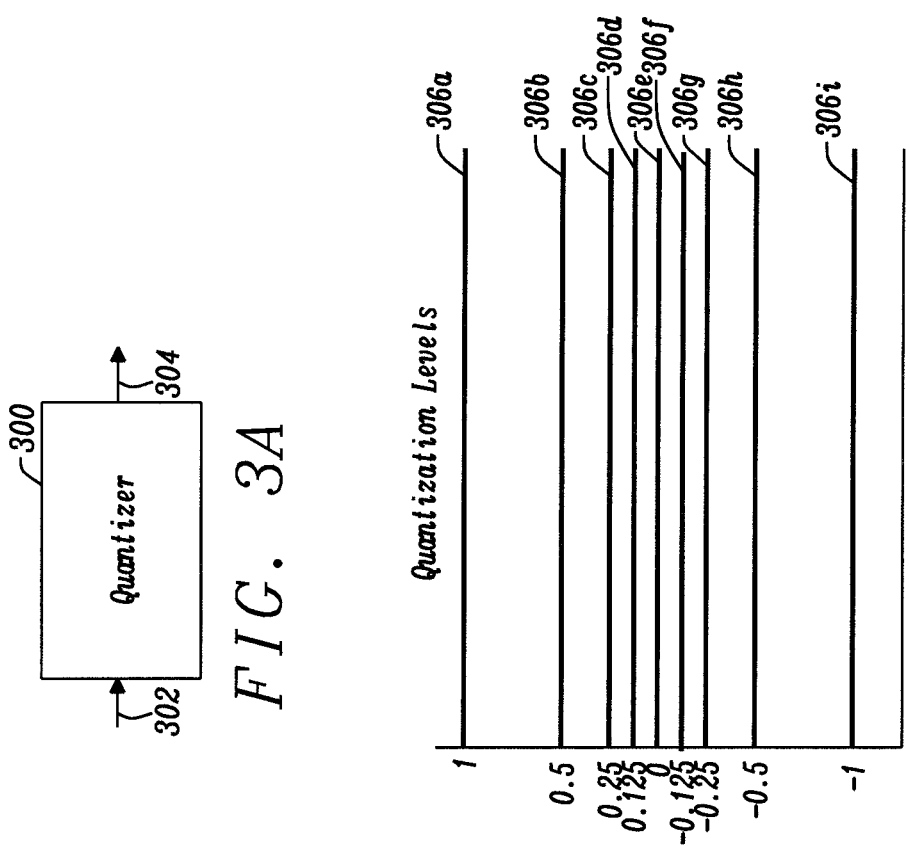
*FIG. 3B*

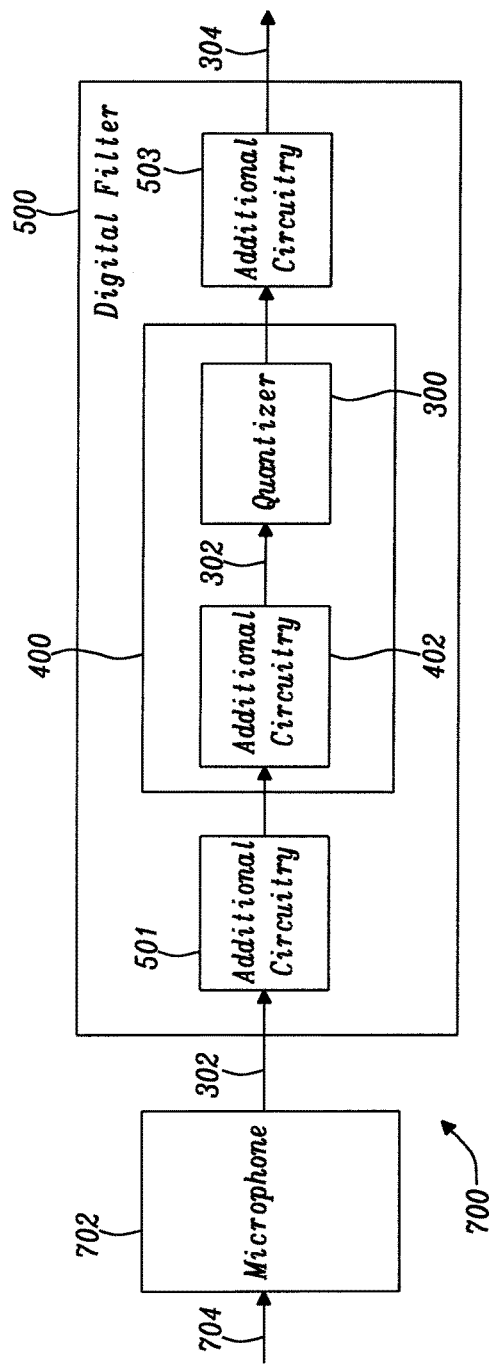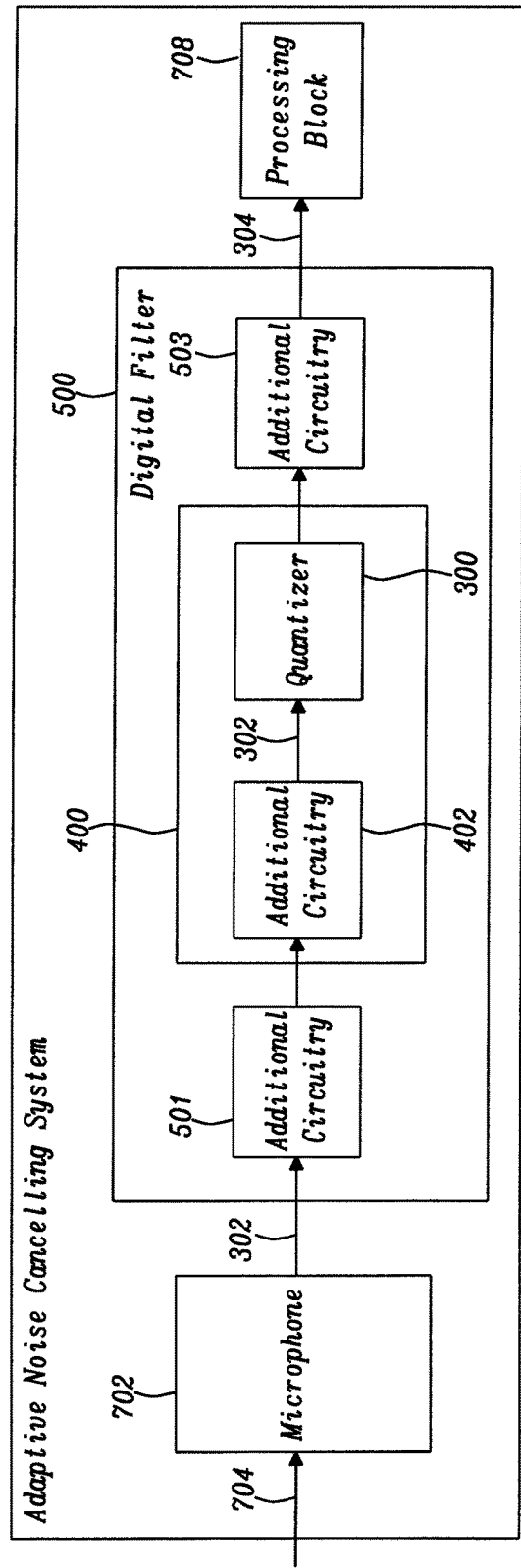

QUANTIZER

RELATED PATENT APPLICATIONS

This application is related to application Ser. No. 16/407,250, filed on May 9, 2019 application Ser. No. 16/407,247, filed on May 9, 2019, application Ser. No. 16/407,254, filed on May 9, 2019, application Ser. No. 16/407,232, filed on May 9, 2019 and application Ser. No. 16/407,227, filed on May 9, 2019, all of which are assigned to a common assignee, and all of which are incorporated by reference in their entirety.

TECHNICAL FIELD

The present disclosure relates to a quantizer. In particular, the present disclosure relates to a quantizer for use in the field of acoustic digital signal processing. In particular, the present disclosure relates to a quantizer for a sigma-delta modulator circuit that may be used as a component within an adaptive-noise cancelling headphone.

BACKGROUND

Adaptive-noise cancelling systems, such as adaptive-noise cancelling headphones typically use a digital microphone to sample and filter external noise. Digital microphones typically output pulse-density modulated (PDM) signals and therefore operate at a very high sampling rate. A microphone may comprise a digital filter that functions as an acoustic filtering system by filtering an input audio signal received by the microphone. It is necessary that the digital filter operates at the sampling rate of the microphone or higher.

A pulse-code modulated (PCM) signal encodes pulses of different heights at a constant frequency. A PCM signal is multi-bit and is typically at the Nyquist frequency. A PDM signal encodes pulses of the same height, hence it requires only one bit that can take any two values (usually represented as 0 and 1 or as 1 and −1); a PDM signal is a single-bit signal. Typically, a PDM signal will be lower resolution but with a higher sampling frequency than a PCM signal.

The different heights may be referred to as quantization levels. PCM signals have multiple quantization levels, whereas a PDM signal has two quantization levels.

FIG. 1A (Graph/https://en.wikipedia.org/wiki/Pulse-code_modulation/CC BY-SA 3.0/redrawn and labelled) shows an example of a PCM signal 100 and FIG. 1B shows an example of a PDM signal 102. Each of the signals 100, 102 are discrete time signals that may be represented by x[n], where n is a discrete time value. In each case the signals 100, 102 show conversion of a sine wave 103 to the respective formats.

Each of the signals 100, 102 has a value at each of the discrete time values. For example, the PCM signal has a value of 8 at a discrete time value of 1, such that x[1]=8 (as shown at point 104 in the Figure), and the PDM signal 102 has a value of 1 at a discrete time value of 4, such that x[4]=1 (as shown at point 106 in the Figure).

It is desirable to have a signal to noise ratio (SNR) in an acoustic filtering system that is above a level at which noise is audible to a user. Existing systems show that the SNR is increased as the oversampling ratio of a PDM signal is increased. The oversampling ratio is the ratio of the sampling rate to the Nyquist rate. "Oversampling" is in reference to the signal being sampled above the Nyquist frequency. In a hardware system using a digital microphone, the sampling rate is limited in practice by the maximum clock frequency which can be sent to the microphone. Upsampling can be used to increase the sampling rate further but increasing the filter clock rate will increase power consumption of a device.

Existing digital filters for filtering PDM signals make use of sigma-delta modulators.

The typical methods to increase the SNR of the sigma-delta modulator used within a PDM-rate digital filter (and therefore the SNR of the digital filter itself) are to increase one or both of: the order of the sigma-delta modulator; and the number of quantization levels used. A sigma-delta modulator comprises a quantizer. The quantizer is a component used to quantize a signal by mapping its amplitude over discrete time intervals to pre-defined quantization levels.

The disadvantage of increasing the order of the modulator is decreased stability at higher input levels. The disadvantage of increasing the number of quantization levels is that more multiplication operations are required, which requires additional silicon area to include the required circuitry. In the case of Quasi-Orthonormal Structure (QOS) filters, an n-th order digital filter requires n sigma-delta modulators and a number of multiplication operations equal to double the number of sigma-delta modulators. 2-level quantization is preferred for this structure as it allows multiplications to be implemented as multiplexers.

SUMMARY

It is desirable to provide an improved quantizer that can improve the SNR of a digital filter whilst maintaining an energy efficient operation and minimising the required area for a hardware implementation.

According to a first aspect of the disclosure there is provided a quantizer configured to receive an input signal comprising successive input values, quantize the input signal at discrete intervals to form a quantized signal by mapping the input value of the input signal at each interval to one of a plurality of quantization levels comprising three or more quantization levels that are non-uniformly spaced, wherein the plurality of quantization levels comprises a first portion comprising two or more quantization levels each i) having the same sign, and ii) being proportional to a first fraction having one as its numerator and two to a power of a first variable as its denominator, the first variable being an integer and having a different value for each of the two or more quantization levels of the first portion.

Optionally, the two or more quantization levels of the first portion are positive quantization levels having a positive sign or the two or more quantization levels of the first portion are negative quantization levels having a negative sign.

Optionally, the two or more quantization levels of the first portion successively decrease in absolute value from a first quantization level, wherein each successive quantization level of the first portion after the first quantization level is proportional to the first fraction where the first variable increases by a first step value for each successive quantization level, and the first step value is an integer that is greater than or equal to one.

Optionally, the first variable is equal to zero for the first quantization level.

Optionally, each quantization level of the first portion is equal to the first fraction or equal to the negative of the first fraction.

Optionally, the quantization levels comprise a quantization level that is equal to zero.

Optionally, the plurality of quantization levels comprises a second portion comprising two or more quantization levels each i) having the same sign, and ii) being proportional to a second fraction having one as its numerator and two to a power of a second variable as its denominator, the second variable being an integer and having a different value for each of the two or more quantization levels of the second portion. Optionally, the two or more quantization levels of the first portion of quantization levels are positive quantization levels having a positive sign and the two or more quantization levels of the second portion of quantization levels are negative quantization levels having a negative sign.

Optionally, the negative quantization levels are equal to the negative of the positive quantization levels.

Optionally, the input signal comprises two or more levels of quantization.

Optionally, the input signal is one of: a sigma-delta modulated signal, a pulse-code modulated (PCM) signal and a pulse-density modulated (PDM) signal.

According to a second aspect of the disclosure there is provided a sigma-delta modulator comprising a quantizer configured to receive an input signal comprising successive input values, quantize the input signal at discrete intervals to form a quantized signal by mapping the input value of the input signal at each interval to one of a plurality of quantization levels comprising three or more quantization levels that are non-uniformly spaced, wherein the plurality of quantization levels comprises a first portion comprising two or more quantization levels each i) having the same sign, and ii) being proportional to a first fraction having one as its numerator and two to a power of a first variable as its denominator, the first variable being an integer and having a different value for each of the two or more quantization levels of the first portion.

Optionally, the two or more quantization levels of the first portion are positive quantization levels having a positive sign or the two or more quantization levels of the first portion are negative quantization levels having a negative sign.

Optionally, the two or more quantization levels of the first portion successively decrease in absolute value from a first quantization level, wherein each successive quantization level of the first portion after the first quantization level is proportional to the first fraction where the first variable increases by a first step value for each successive quantization level, and the first step value is an integer that is greater than or equal to one.

Optionally, the first variable is equal to zero for the first quantization level.

Optionally, each quantization level of the first portion is equal to the first fraction or equal to a negative of the first portion.

Optionally, the sigma-delta modulator is configured to output the quantized signal that is generated by the quantizer.

It will be appreciated that the sigma-delta modulator of the second aspect may include providing and/or using features set out in the first aspect and can incorporate other features as described herein.

According to a third aspect of the disclosure there is provided a digital filter comprising a sigma-delta modulator comprising a quantizer configured to receive an input signal comprising successive input values, quantize the input signal at discrete intervals to form a quantized signal by mapping the input value of the input signal at each interval to one of a plurality of quantization levels comprising three or more quantization levels that are non-uniformly spaced, wherein the plurality of quantization levels comprises a first portion comprising two or more quantization levels each i) having the same sign, and ii) being proportional to a first fraction having one as its numerator and two to a power of a first variable as its denominator, the first variable being an integer and having a different value for each of the two or more quantization levels of the first portion.

It will be appreciated that the digital filter of the third aspect may include providing and/or using features set out in the first aspect and/or the second aspect and can incorporate other features as described herein.

According to a fourth aspect of the disclosure an apparatus comprising a microphone for receiving an acoustic signal configured to the convert the acoustic signal into an input signal in a digital format suitable for digital processing, and a digital filter comprising a sigma-delta modulator comprising a quantizer configured to receive the input signal comprising successive input values, quantize the input signal at discrete intervals to form a quantized signal by mapping the input value of the input signal at each interval to one of a plurality of quantization levels comprising three or more quantization levels that are non-uniformly spaced, wherein the plurality of quantization levels comprises a first portion comprising two or more quantization levels each i) having the same sign, and ii) being proportional to a first fraction having one as its numerator and two to a power of a first variable as its denominator, the first variable being an integer and having a different value for each of the two or more quantization levels of the first portion.

It will be appreciated that the apparatus of the fourth aspect may include providing and/or using features set out in the first aspect and/or the second aspect and/or the third aspect and can incorporate other features as described herein.

According to a fifth aspect of the disclosure there is provided an adaptive noise cancelling system comprising an apparatus comprising a microphone for receiving an acoustic signal configured to the convert the acoustic signal into an input signal in a digital format suitable for digital processing, and a digital filter comprising a sigma-delta modulator comprising a quantizer configured to receive the input signal comprising successive input values, quantize the input signal at discrete intervals to form a quantized signal by mapping the input value of the input signal at each interval to one of a plurality of quantization levels comprising three or more quantization levels that are non-uniformly spaced, wherein the plurality of quantization levels comprises a first portion comprising two or more quantization levels each i) having the same sign, and ii) being proportional to a first fraction having one as its numerator and two to a power of a first variable as its denominator, the first variable being an integer and having a different value for each of the two or more quantization levels of the first portion.

Optionally, the adaptive noise cancelling system is implemented within a headphone or a set of headphones.

It will be appreciated that the adaptive noise cancelling system of the fifth aspect may include providing and/or using features set out in the first aspect and/or the second aspect and/or the third aspect and/or the fourth aspect and can incorporate other features as described herein.

According to a sixth aspect of the disclosure there is provided an apparatus comprising a shifter circuit for providing a bit shifting operation, and a quantizer configured to receive an input signal comprising successive input values, quantize the input signal at discrete intervals to form a quantized signal by mapping the input value of the input signal at each interval to one of a plurality of quantization levels comprising three or more quantization levels that are non-uniformly spaced, wherein the plurality of quantization levels comprises a first portion comprising two or more quantization levels each i) having the same sign, and ii) being proportional to a first fraction having one as its numerator and two to a power of a first variable as its denominator, the first variable being an integer and having a different value for each of the two or more quantization levels of the first portion, wherein the shifter circuit is configured to receive the quantized signal from the quantizer and to perform one or more bit shifting operations using the quantized signal.

It will be appreciated that the apparatus of the sixth aspect may include providing and/or using features set out in the first aspect and/or the second aspect and/or the third aspect and/or the fourth aspect and/or the fifth aspect and can incorporate other features as described herein.

According to a seventh aspect of the disclosure there is provided a method of quantizing an input signal using a quantizer, the method comprising receiving the input signal comprising successive input values, quantizing the input signal at discrete intervals to form a quantized signal by mapping the input value of the input signal at each interval to one of a plurality of quantization levels comprising three or more quantization levels that are non-uniformly spaced, wherein the plurality of quantization levels comprises a first portion comprising two or more quantization levels each i) having the same sign, and ii) being proportional to a first fraction having one as its numerator and two to a power of a first variable as its denominator, the first variable being an integer and having a different value for each of the two or more quantization levels of the first portion.

It will be appreciated that the method of the seventh aspect may include providing and/or using features set out in the first aspect and can incorporate other features as described herein.

According to an eighth aspect of the disclosure there is provided a method of quantizing an input signal using a sigma-delta modulator comprising a quantizer, the method comprising receiving an input signal comprising successive input values using the quantizer, quantizing the input signal at discrete intervals to form a quantized signal by mapping the input value of the input signal at each interval to one of a plurality of quantization levels comprising three or more quantization levels that are non-uniformly spaced using the quantizer, wherein the plurality of quantization levels comprises a first portion comprising two or more quantization levels each i) having the same sign, and ii) being proportional to a first fraction having one as its numerator and two to a power of a first variable as its denominator, the first variable being an integer and having a different value for each of the two or more quantization levels of the first portion.

It will be appreciated that the method of the eighth aspect may include providing and/or using features set out in the second aspect and can incorporate other features as described herein.

According to a ninth aspect of the disclosure there is provided a method of quantizing an input signal using a digital filter comprising a sigma-delta modulator comprising a quantizer, the method comprising receiving an input signal comprising successive input values using the quantizer, quantizing the input signal at discrete intervals to form a quantized signal by mapping the input value of the input signal at each interval to one of a plurality of quantization levels comprising three or more quantization levels that are non-uniformly spaced using the quantizer, wherein the plurality of quantization levels comprises a first portion comprising two or more quantization levels each i) having the same sign, and ii) being proportional to a first fraction having one as its numerator and two to a power of a first variable as its denominator, the first variable being an integer and having a different value for each of the two or more quantization levels of the first portion.

It will be appreciated that the method of the ninth aspect may include providing and/or using features set out in the third aspect and can incorporate other features as described herein.

According to a tenth aspect of the disclosure there is provided a method of quantizing an input signal using an apparatus comprising a microphone for receiving an acoustic signal configured to the convert the acoustic signal into an input signal in a digital format suitable for digital processing, and a digital filter comprising a sigma-delta modulator comprising a quantizer, the method comprising receiving the input signal comprising successive input values using the quantizer, quantizing the input signal at discrete intervals to form a quantized signal by mapping the input value of the input signal at each interval to one of a plurality of quantization levels comprising three or more quantization levels that are non-uniformly spaced using the quantizer, wherein the plurality of quantization levels comprises a first portion comprising two or more quantization levels each i) having the same sign, and ii) being proportional to a first fraction having one as its numerator and two to a power of a first variable as its denominator, the first variable being an integer and having a different value for each of the two or more quantization levels of the first portion.

It will be appreciated that the method of the tenth aspect may include providing and/or using features set out in fourth aspect and can incorporate other features as described herein.

According to an eleventh aspect of the disclosure there is provided a method of quantizing an input signal using an adaptive noise cancelling system comprising an apparatus comprising a microphone for receiving an acoustic signal configured to the convert the acoustic signal into an input signal in a digital format suitable for digital processing, and a digital filter comprising a sigma-delta modulator comprising a quantizer, the method comprising receiving the input signal comprising successive input values using the quantizer, quantizing the input signal at discrete intervals to form a quantized signal by mapping the input value of the input signal at each interval to one of a plurality of quantization levels comprising three or more quantization levels that are non-uniformly spaced using the quantizer, wherein the plurality of quantization levels comprises a first portion comprising two or more quantization levels each i) having the same sign, and ii) being proportional to a first fraction having one as its numerator and two to a power of a first variable as its denominator, the first variable being an integer and having a different value for each of the two or more quantization levels of the first portion.

It will be appreciated that the method of the eleventh aspect may include providing and/or using features set out in the fifth aspect and can incorporate other features as described herein.

According to a twelfth aspect of the disclosure there is provided a method of quantizing an input signal using an apparatus comprising a shifter circuit for providing a bit shifting operation, and a quantizer, the method comprising receiving an input signal comprising successive input values using the quantizer, quantizing the input signal at discrete intervals to form a quantized signal by mapping the input value of the input signal at each interval to one of a plurality of quantization levels comprising three or more quantization levels that are non-uniformly spaced using the quantizer, wherein the plurality of quantization levels comprises a first portion comprising two or more quantization levels each i) having the same sign, and ii) being proportional to a first fraction having one as its numerator and two to a power of a first variable as its denominator, the first variable being an integer and having a different value for each of the two or more quantization levels of the first portion, and using the shifter circuit to receive the quantized signal from the quantizer and to perform one or more bit shifting operations using the quantized signal.

It will be appreciated that the method of the twelfth aspect may include providing and/or using features set out in sixth aspect and can incorporate other features as described herein.

BRIEF DESCRIPTION OF THE DRAWINGS

The disclosure is described in further detail below by way of example and with reference to the accompanying drawings, in which:

FIG. 3A is a schematic of a quantizer for a sigma-delta modulator in accordance with a first embodiment of the present disclosure, FIG. 3B is a graph of nine quantization levels for the quantizer of FIG. 3A and FIG. 3C shows an input-output graph for the quantizer of FIG. 3A;

FIG. 7A is a schematic of an apparatus in accordance with a fifth embodiment of the present disclosure and FIG. 7B is a schematic of an adaptive noise cancelling (ANC) system in accordance with a sixth embodiment of the present disclosure.

DESCRIPTION

Figure 2C:
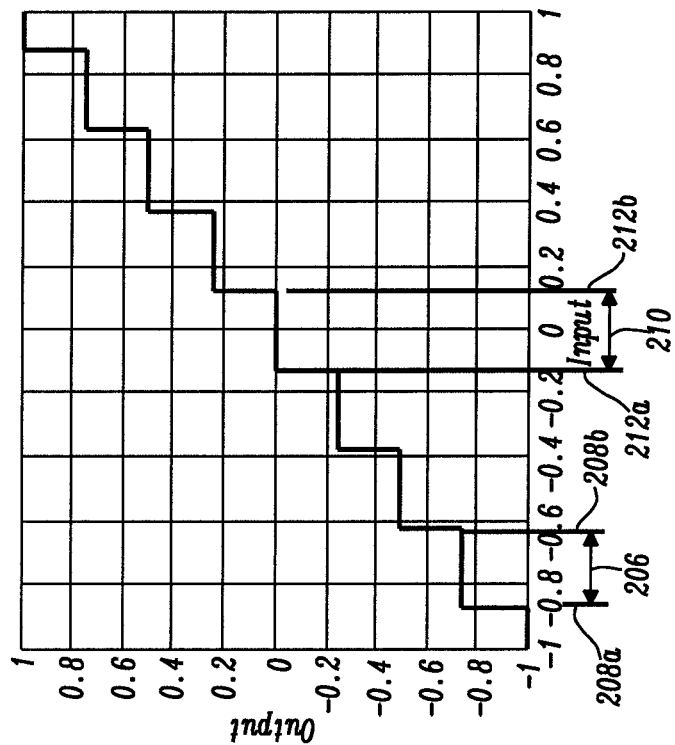
FIG. 2B is a graph of nine quantization levels for a 9-level mid-tread quantizer and FIG. 2C shows an input-output graph for the 9-level mid trade quantizer with the quantization levels shown in FIG. 2B.
Figure 2A:
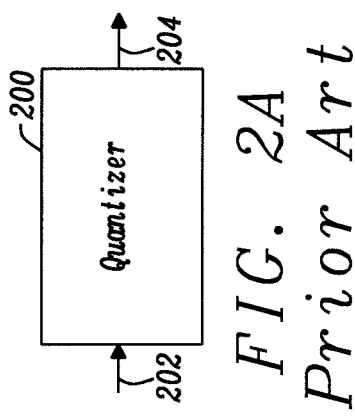
FIG. 2A is a schematic of a quantizer in accordance with the prior art.
Figure 2B:
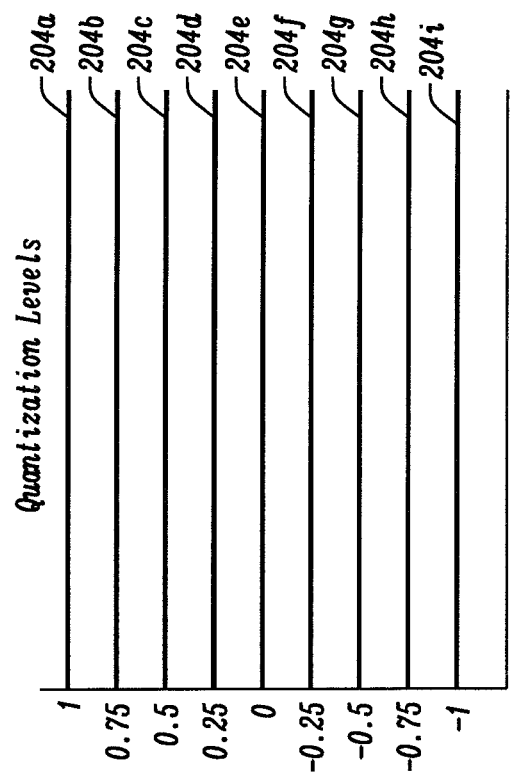

FIG. 2A is a schematic of a quantizer 200 in accordance with the prior art. In operation the quantizer 200 receives an input signal 202 and provides a quantized output signal 204. The quantizer 200 maps the input signal 202 at discrete time intervals to uniformly spaced quantization levels across the range of values that may be occupied by the input signal 202. FIG. 2B is a graph of nine quantization levels (labelled 204a to 204i) that denote the values that the quantized output signal 204 may occupy to for a 9-level mid-tread quantizer. FIG. 2C shows an input-output graph of how the values of the input signal 202 are mapped to the quantization levels 204a-204i to generate the quantized output signal 204. The x axis shows the values that the input signal 202 may take, and the y axis shows the values that the output signal 204 may take for specific input signal 202 values. For example, if the input signal 202 has a value within a range 206 from a first point 208a to a second point 208b at a first time interval, then the output signal 204 will have a value of −0.75 at the first time interval. If the input signal 202 changes to a value within a range 210 from a first point 212a to a second point 212b at a second time interval, then the output signal 204 will have a value of zero at the second time interval.

Figure 1A:
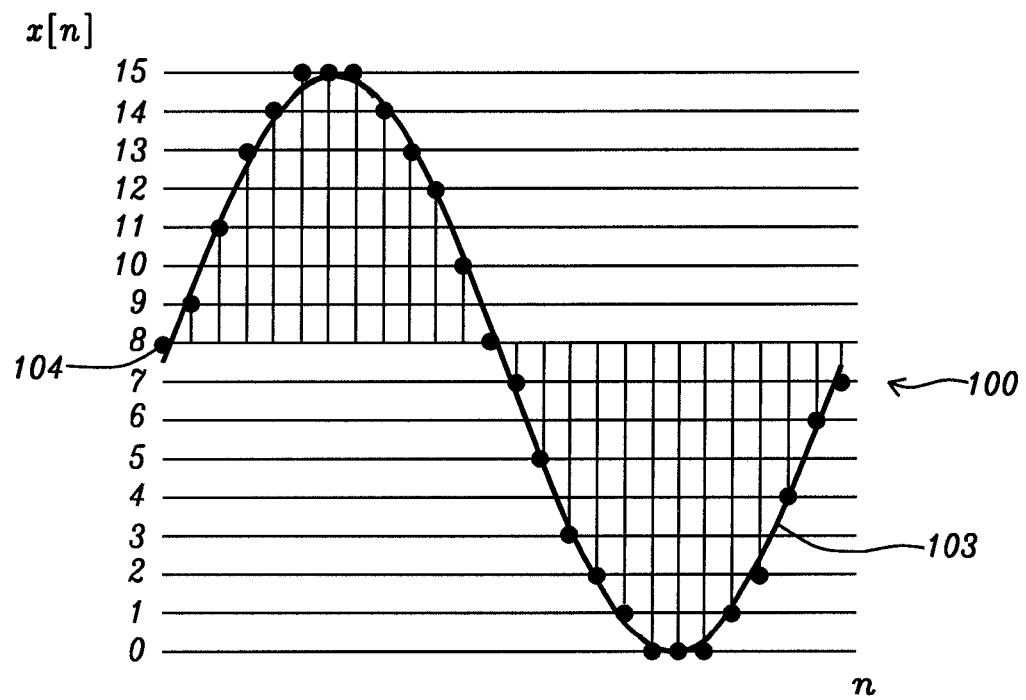
FIG. 1A is a graph of a pulse code modulation signal and FIG. 1B is a graph of a pulse density modulation signal.
Figure 1B:
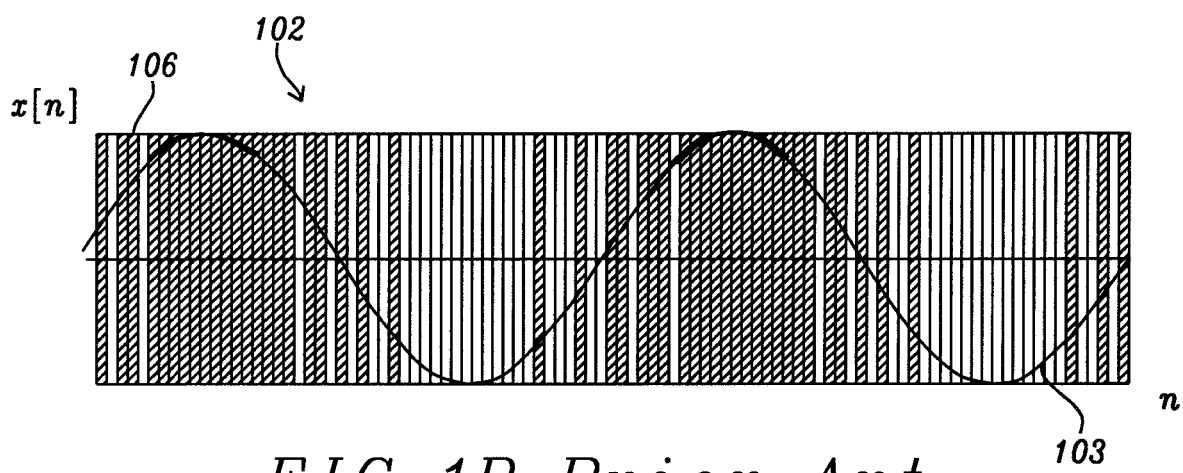

FIG. 3A is a schematic of a quantizer 300 for a sigma-delta modulator in accordance with a first embodiment of the present disclosure. The quantizer 300 is configured to receive an input signal 302 comprising successive input values. The input signal 302 may comprise two or more levels of quantization. For example the input signal 302 may be a PCM signal (of the type shown in FIG. 1A) or a PDM signal (of the type shown in FIG. 1B) that may be received from a sigma-delta modulator. Alternatively, the input signal 302 may be a sigma-delta modulated signal received from a sigma-delta modulator and comprising three or more quantization levels. It will be appreciated that a sigma-delta modulated signal having two levels of quantization is a PDM signal. Alternatively, the input signal 302 may be a continuous signal that varies with time. The quantizer 300 is configured to quantize the input signal 302 at discrete intervals to form a quantized signal 304 that can be output by the quantizer 300. The discrete intervals may be discrete time intervals.

The quantized signal 304 is formed by mapping the input value of the input signal 302 at each interval to one of N quantization levels that are non-uniformly spaced, where N is an integer that is greater than three.

Non-uniform spacing of the quantization levels means that the spacing between quantization levels is unequal across the plurality of quantization levels. For example, three quantization levels having values 1, 0.25 and 0 have non-uniform spacing because there is a spacing of 0.75 between 1 and 0.25 and a spacing of 0.25 between 0.25 and 0.

The N quantization levels comprise a first portion comprising two or more quantization levels. Each of the two or more quantization levels have the same sign and are proportional to a first fraction having one as its numerator and two to a power of a first variable as its denominator. The first variable is an integer that has a different value for each of the two or more quantization levels of the first portion.

The two or more quantization levels of the first portion may be positive quantization levels having a positive sign or may be negative quantization levels having a negative sign.

For example, the N quantization levels may comprise three quantization levels that are proportional to 1, 0.25 and 0. The first portion comprises 1 and 0.25 which are positive quantization levels. Additionally, 1 and 0.25 may be represented as follows:

$$1 = \frac{1}{2^0} \qquad (1)$$

-continued $$0.25 = \frac{1}{2^2} \quad (2)$$

Equations (1) and (2) demonstrate that 1 and 0.25 are proportional to the first fraction as previously described. In the present example, each of the quantization levels are equal to their respective first fractions having the appropriate first variable.

Furthermore, the three quantization levels have non-uniform spacing as there is a spacing of 0.75 between 1 and 0.25 and a spacing of 0.25 between 0.25 and zero.

The two or more quantization levels of the first portion successively decrease in absolute value from a first quantization level. Each successive quantization level of the first portion after the first quantization level is proportional to the first fraction where the first variable increases by a first step value for each successive quantization level. The first step value is an integer that is greater than or equal to one.

In the present example, the first quantization level is equal to 1, as represented by equation (1). In equation (1) the first variable is equal to zero. The next quantization level is represented by equation (2) and the first variable has increased by the step value, where the step value is equal to two. In further embodiments, the first variable may initially be equal to a non-zero value.

The N quantization levels may comprise a second portion comprising two or more quantization levels each having the same sign and being proportional to a second fraction having one as its numerator and two to a power of a second variable as its denominator. The second variable is an integer that has a different value for each of the two or more quantization levels of the second portion.

In a specific embodiment, the two or more quantization levels of the first portion of quantization levels may be positive quantization levels having a positive sign and the two or more quantization levels of the second portion of quantization levels may be negative quantization levels having a negative sign.

The negative quantization levels may be equal to the negative of the positive quantization levels. For example, the quantization levels may be 1, 0.25, 0, −0.25, −1, where 1, 0.25 are the positive quantization levels and −0.25, 1 are the negative quantization levels.

FIG. 3B is a graph of nine (N=9) quantization levels (306a-306i). In the present example, the quantized signal 304 may take any one of nine values as determined by the values of the nine quantization levels 306a-306i.

The positive quantization levels in the present example are: 1, 0.5, 0.25 and 0.125; the negative quantization levels in the present example are −1, −0.5, −0.25 and −0.125; and there is a quantization level equal to 0.

FIG. 3C shows an input-output graph 308 of how the values of the input signal 302 are mapped to the quantization levels 306a-306i to generate the quantized signal 304. The x axis shows the values that the input signal 302 may take, and the y axis shows the values that the quantized signal 304 may take for specific input signal 302 values.

FIG. 3B shows how the quantization levels are distributed in a 9-level mid-tread implementation of the proposed quantization scheme. In the present disclosure the quantization levels are non-uniformly spaced.

The N quantization levels comprise positive quantization levels and negative quantization levels. In the present example with nine quantization levels there are four positive quantization levels (306a-306d) and four negative quantization levels (306f-306i). The negative quantization levels are equal to the negative of the positive quantization levels. For example, the quantization level 306a is equal to the negative of the quantization level 306i. In the present embodiment, the positive quantization levels may be said to be exponentially spaced and the negative quantization levels may be said to be exponentially spaced.

The positive quantization levels 306a-306d successively decrease in absolute value from a first positive quantization level. In the present example, the first positive quantization level is the quantization level 306a. The quantization level 306b is less than the quantization level 306a, the quantization level 306c is less than the quantization level 306b and the quantization level 306d is less than the quantization level 306c.

As discussed previously, each positive quantization level 306a-306d is proportional to the first fraction having one as its numerator and two to the power of the first variable as its denominator as may be represented by the following equation:

$$Q_+(k) \propto \frac{1}{(2)^k} \quad (3)$$

where $Q_+(k)$ is a positive quantization level and k is the first variable.

The negative quantization levels may be represented as follows:

$$Q_-(k) \propto \frac{-1}{(2)^k} \quad (4)$$

where $Q_-(k)$ is a negative quantization level.

In the present embodiment, for the first quantization level the first variable k is equal to zero such that:

$$Q_+(0) \propto \frac{1}{(2)^0} \quad (5)$$

Each successive positive quantization level after the first quantization level is proportional to the first fraction where the first variable increases by a first step value for each successive positive quantization level. In the present embodiment, the first step value is equal to 1.

Therefore, the first variable k will progress incrementally from zero to a third variable m to define each of the positive quantization levels, the negative of which provides the negative quantization levels.

If N is an even number the third variable m is equal to a third fraction minus one, where the third fraction has N as its numerator and two as its denominator, as follows:

$$m = \frac{N}{2} - 1 \quad (6)$$

By way of example, assuming that there are six quantization levels, such that N=6, the third variable m will be equal to two (m=2) in accordance with equation (6). Therefore, there are three positive quantization levels and three negative quantization levels as follows providing the six quantization levels, Q, as follows:

$$Q \propto \left\{ -\frac{1}{(2)^0}, -\frac{1}{(2)^1}, -\frac{1}{(2)^2}, \frac{1}{(2)^2}, \frac{1}{(2)^1}, \frac{1}{(2)^0} \right\} \quad (7)$$

The quantization levels Q may be presented more generally as follows:

$$Q \propto \left\{ -\frac{1}{(2)^0}, \cdots, -\frac{1}{(2)^m}, \frac{1}{(2)^m}, \cdots, \frac{1}{(2)^0} \right\} \quad (8)$$

If N is an odd number the third variable m is equal to a fourth fraction minus one, where the fourth fraction has N minus one as its numerator and two as its denominator, as follows:

$$m = \frac{N-1}{2} - 1 \quad (9)$$

When N is an odd number the N quantization levels may comprise a quantization level that is equal to zero.

By way of example, assuming that there are seven quantization levels, such that N=7, the third variable m will be equal to two (m=2) in accordance with equation (9).

Therefore, there are three positive quantization levels, three negative quantization levels and a quantization level equal to zero, as follows providing the seven quantization levels, Q, as follows:

$$Q \propto \left\{ -\frac{1}{(2)^0}, -\frac{1}{(2)^1}, -\frac{1}{(2)^2}, 0, \frac{1}{(2)^2}, \frac{1}{(2)^1}, \frac{1}{(2)^0} \right\} \quad (10)$$

The quantization levels Q may be presented more generally as follows:

$$Q \propto \left\{ -\frac{1}{(2)^0}, \cdots, -\frac{1}{(2)^m}, 0, \frac{1}{(2)^m}, \cdots, \frac{1}{(2)^0} \right\} \quad (11)$$

The input signal 302 may comprise two or more levels of quantization.

In a further embodiment each positive quantization level may be equal to the first fraction and each successive positive quantization level after the first quantization level is equal to the first fraction where the first variable k increases by the first step value for each successive positive quantization level.

In the present embodiment, the positive quantization levels may be represented as follows:

$$Q_+(k) = \frac{1}{(2)^k} \quad (12)$$

In the present embodiment, the negative quantization levels may be represented as follows:

$$Q_-(k) = \frac{-1}{(2)^k} \quad (13)$$

In the present embodiment, for an even number of quantization levels, the quantization levels Q may be presented generally as follows:

$$Q = \left\{ -\frac{1}{(2)^0}, \cdots, -\frac{1}{(2)^m}, \frac{1}{(2)^m}, \cdots, \frac{1}{(2)^0} \right\} \quad (14)$$

In the present embodiment, for an odd number of quantization levels, the quantization levels Q may be presented generally as follows:

$$Q = \left\{ -\frac{1}{(2)^0}, \cdots, -\frac{1}{(2)^m}, 0, \frac{1}{(2)^m}, \cdots, \frac{1}{(2)^0} \right\} \quad (15)$$

In a specific embodiment, the quantizer 300 may be configured to compare the input signal 302 with a midpoint between neighbouring quantization levels rather than comparing the input signal 302 with the negative quantization levels. It is then possible to pre-scale the input signal 302, (by multiplying the input signal by $2^{-f}$, where f is the exponent) and to negate the negative values of the input signal 302, to enable a reduction the number of comparators that are otherwise required. The reduction in the number of comparators, compared with other quantizers, can result in a reduction in area and power of the quantizer 300.

For example, typically a non-uniform quantizer with N levels requires N−1 comparators. If the quantization levels are placed symmetrically around 0, it is possible to half the number of comparators by negating negative values and using a quantizer with N/2 positive quantization levels. If these quantization levels are exponentially spaced, it is possible to extract the exponent and then only quantize the mantissa. For non-negative PCM encoded data the exponent is the number of leading 0s of the binary representation. When the mantissa is a single bit (0 or 1) the quantizer may be implemented with a single comparator. This contrasts with a uniform quantizer, which requires at least 2 log N comparators.

In practice it is not necessary to compare the input signal 302 with the exact midpoint and an approximate value of the midpoint can be sufficient, thereby further reducing complexity, resulting in a further reduction in hardware area and power requirements.

Figure 4:
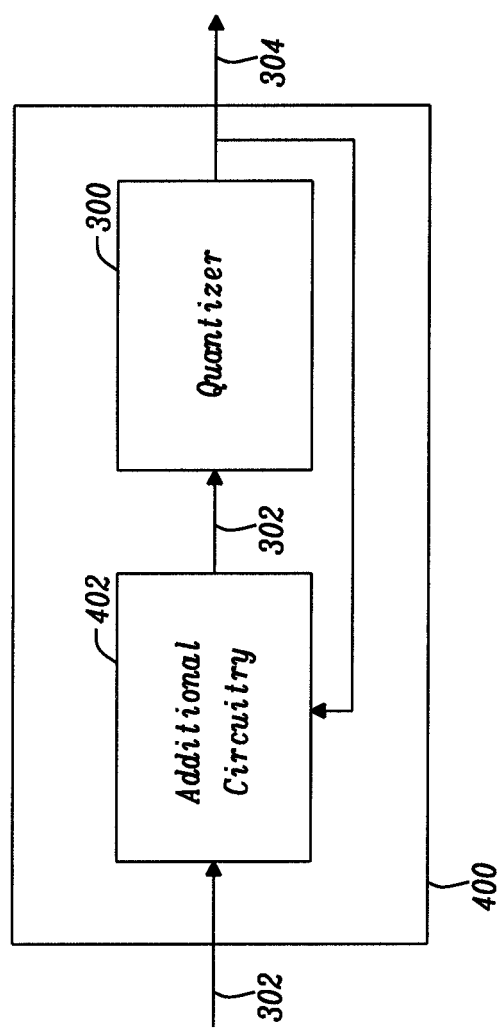
FIG. 4 is a schematic of a sigma-delta modulator in accordance with a second embodiment of the present disclosure.

FIG. 4 is a schematic of a sigma-delta modulator 400 in accordance with a second embodiment of the present disclosure. The sigma-delta modulator 400 comprises the quantizer 300, as previously described. Common reference numerals and variables between Figures represents common features.

The sigma-delta modulator 400 may comprise additional circuitry 402 which processes the input signal 302 prior to it being proved to the quantizer 300. The sigma-delta modulator 400 may be configured to output the quantized signal 304 that is generated by the quantizer 300. The quantized signal 304 may be fed back into the additional circuitry 402 within the sigma-delta modulator 400.

Figure 5A:
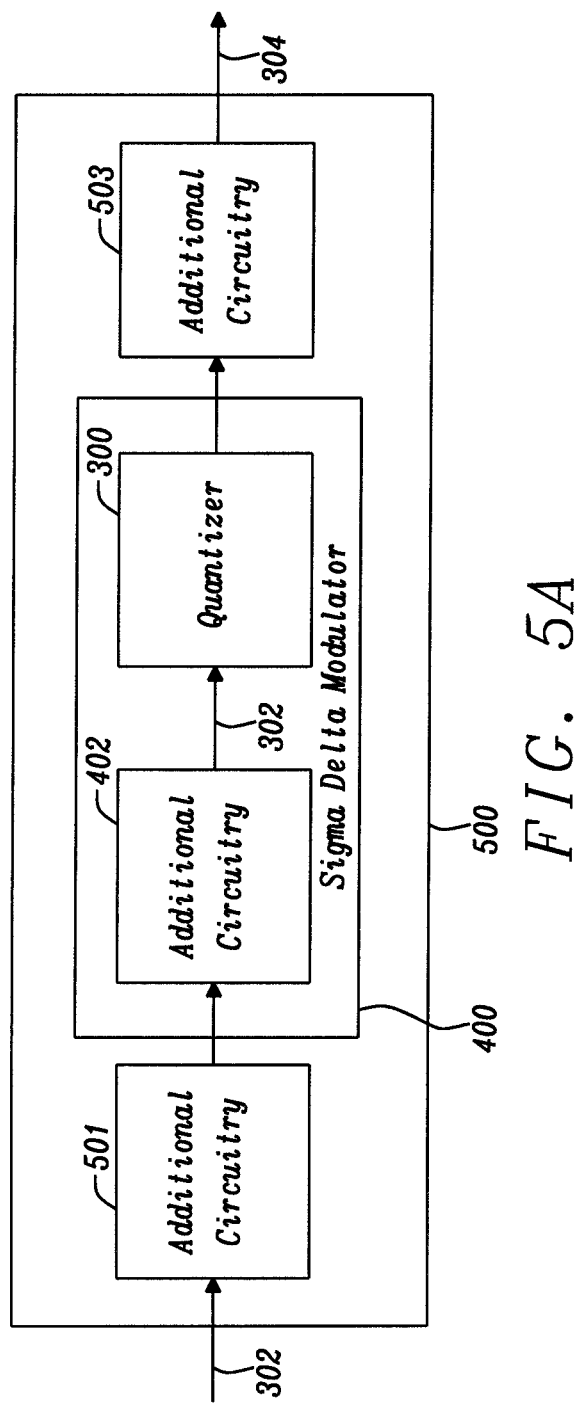
FIG. 5A is a schematic of a digital filter in accordance with a third embodiment of the present disclosure and FIG. 5B is a digital filter corresponding to a specific embodiment of the digital filter of FIG. 5A and in accordance with a fourth embodiment of the present disclosure.

FIG. 5A is a schematic of a digital filter 500 for filtering a frequency component of the input signal 302 comprising the sigma-delta modulator 400 comprising the quantizer 300 in accordance with a third embodiment of the present disclosure. The digital filter 500 may comprise additional circuitry 501, 503 at various points in the signal path in accordance with the understanding of the skilled person. Common reference numerals and variables between Figures represent common features.

Figure 5B:
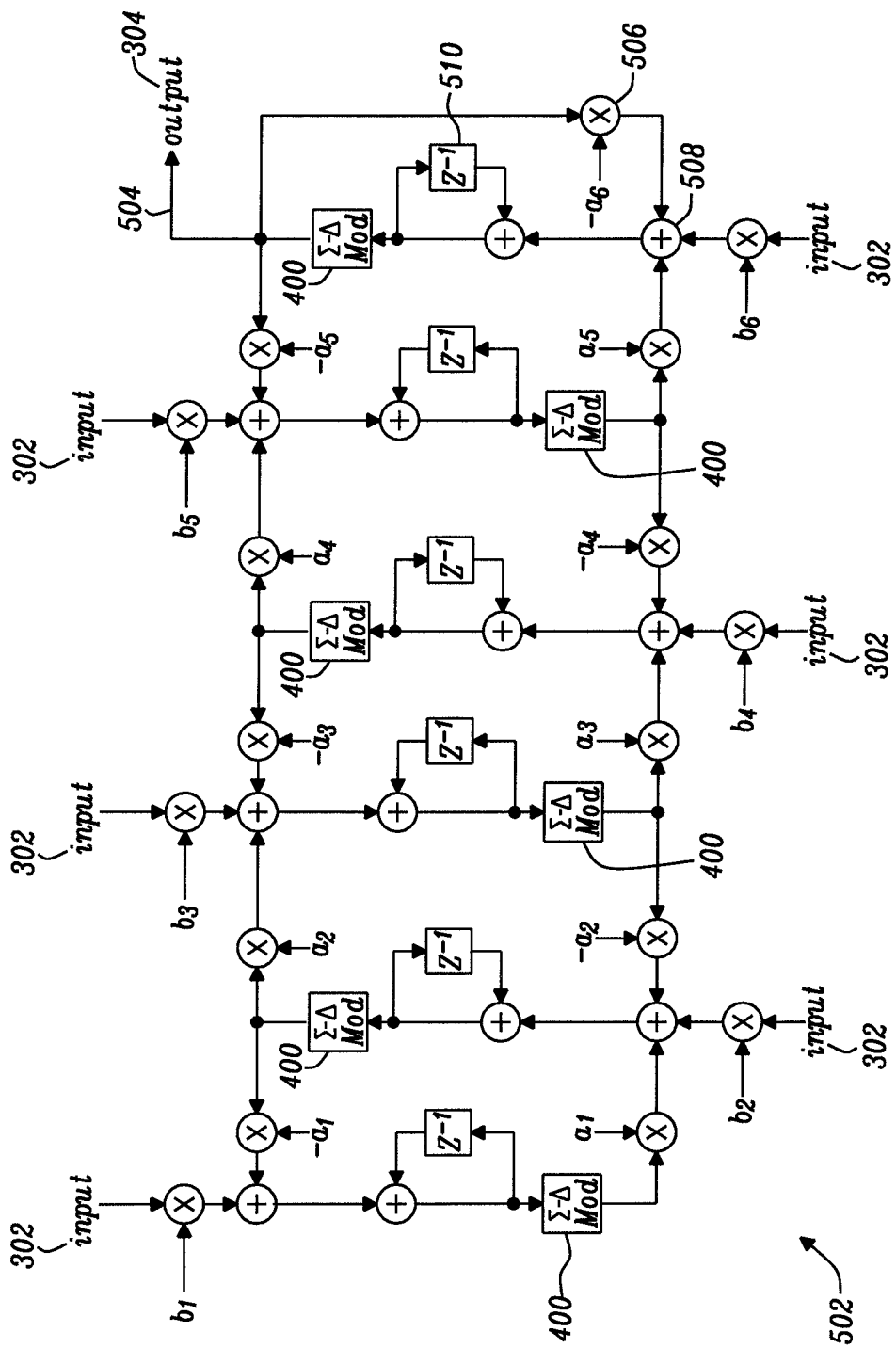

FIG. 5B is a digital filter 502 corresponding to a specific embodiment of the digital filter 500 and in accordance with a fourth embodiment of the present disclosure. In the present embodiment, the digital filter 502 is a $6^{th}$ order infinite impulse response (IIR) filter and therefore comprises six sigma delta modulators of the type shown in FIG. 4 (the sigma-delta modulator 400). It will be appreciated that in further embodiments, the digital filter 502 may be a different order and comprise more or less sigma-delta modulators 400 in accordance with the understanding of the skilled person. Common reference numerals and variables between Figures represents common features.

The digital filter 502 has two sets of coefficients (sets a and b) and the input signal 302 is passed to the digital filter 502 in multiple places. In the present embodiment, the input signal 302 is a PDM signal. The quantized signal 304 provided at an output 504 of the digital filter 502 may undergo further processing to convert the quantized signal 304 into a PDM signal having two quantisation levels. The input signal 302 and the quantized signal 304 need not have the same number of quantization levels.

Note that the structure of the digital filter 502 could be transposed, and that it is possible to use other filtering structures with the proposed sigma-delta modulator 400.

The output of the sigma-delta modulators 400 in FIG. 5(b) are only used in multiplication operations, except for at the output 504, which can be converted to a different format as required by subsequent signal processing operations.

The multiplication operations are denoted by the circle symbol with an "x" inside. A single multiplication circuit for performing multiplication operations is labelled 506, with labelling omitted from the other multiplication circuits to aid in the clarity of the drawing. The coefficients, a and b, denote the multiplication factors applied to the signal during the multiplication operation. A subscript succeeds each of the coefficients in the figure to distinguish between different a and b coefficients.

As such, only multiplication operations using the quantized values need to have an efficient implementation, so their representation can optionally be modified to support this. Because all of the sigma-delta modulator 400 output values are exponents of two (as shown by the equations (9) and (13)), multiplication with a coefficient is reduced to a single shifting operation of the coefficient. Therefore, the present disclosure describes a means to select quantization levels that enable subsequent multiplication operations to be achieved using a shifting operation.

The shifting operation refers to a bitwise shift, where values are represented by binary digits, and when performing mathematical operations on these values, the digits may be "shifted" to the left or the right. A value is shifted to the left by v when multiplied by $2^v$. A value is shifted to the right by p when multiplied by $1/(2^p)$ For example, assume the quantized signal 304 has a value of 0.125, which corresponds to $2^{-3}$ (which is the same as $1/(2^3)$). If the quantized signal 304 having this value is passed to a multiplication circuit that multiplies the value (0.125) by a coefficient equal to sixteen (represented in binary as 10000) then the output of the multiplication circuit is two (represented in binary as 10). It can be seen that the digits of the value 10000 have been shifted to the right by three places to result in 10, which is due to z in the present example being equal to negative three.

A shift right may also be referred to as a "shift down", and a shift left may also be referred to as a "shift up". It will be appreciated that in further embodiments, a shifter circuit may be otherwise configured such that a shift may be down for positive exponents and a shift may be up for negative exponents.

As the spacing of the quantisation levels described herein enables multiplication to be carried out using a simple shifting operation, a full hardware multiplier is not required for implementation of the multiplication circuit and the multiplication can be provided by a shifter circuit. Therefore, substantial hardware area can be saved when providing a physical implementation of a circuit implementing the quantizer 300, such as the sigma-delta modulator 400.

Addition, or summing, operations are denoted by a circle symbol with a "+" inside. A single summing circuit is labelled 508, with further labelling of summing circuits omitted to aid in the clarity of the drawing. A delay operation is denoted by a square symbol with a $Z^{-1}$ inside. A single delay circuit for performing a delay operation is labelled 510, with further labelling of delay circuits omitted to aid in the clarity of the drawing.

Each value of the quantized signal 304 may be encoded in a format that enables the quantized signal 304 to be provided directly to a multiplication circuit implemented using a shifter circuit without any intermediate processing. Encoding of the quantized signal 304 may include, for each value of the quantized signal 304, representing the value as a set of two flags and a number representing an exponent value.

The first flag indicates whether or not the value being represented is equal to zero (which is not required if a mid-riser quantizer having an even number of quantizer levels is used) and the second flag indicates the sign of the value being represented. The number representing an exponent value corresponds to the exponent of the value of the quantized signal 304, which may be the first variable k as previously described. For example, if the value of the quantized signal is equal to 2-3 then the exponent value is minus three.

For example, consider a multiplication circuit, implemented using a shifter circuit, being configured to multiply a value received at its input by 0.25 (0.01 in binary). A value of the quantized signal 304 being equal to 0.5 may be represented by the first flag indicating a non-zero value, the second flag indicating a positive value and the value of the exponent being equal to negative one (as 0.5 is equal to $2^{-1}$). The output of the shifter circuit will be 0.125 (0.001 in binary and corresponding to a shift right of one of 0.01).

These flags allow the exponent value to be encoded as a power of two, so that reconstruction of a non-zero value can be achieved by a bitwise shift of 1 for a positive number when the multiplication by a value of the format $1/(2^{val})$:

$$r = 1 >> \text{val} \tag{14a}$$

or −1 for a negative number:

$$r = -(1 >> \text{val}) \tag{14b}$$

where r is a result of an operation and val is the value of the exponent. Equations (14a) and (14b) show a shift right (as denoted by >>) of 1 by the value of the exponent val. "<<" denotes a shift left operation.

It follows that multiplication of a two's complement value represented by z with a non-zero positive quantised value is a bitwise shift down of z:

$$r = z >> \text{val} \tag{15}$$

In the previous example, where the shifter circuit multiplies by 0.25 and the value of the quantized signal 304 is 0.5, r is equal to 0.001, z is equal to 0.01 and val is equal to one.

For a zero-valued quantised number, a multiplication can output a 0 via a multiplexer based on the non-zero flag. For a negative quantised number, the multiplicand must be negated first:

$$r = -z \gg \text{val} \tag{16}$$

If two's complement multiplication output is required and some accuracy can be sacrificed, in order to save area in a hardware implementation, the multiplicand can be bitwise inverted first instead of negated:

$$r = \sim z \gg \text{val} \tag{17}$$

If a sign-magnitude output is required, then the output of the multiplication can be calculated as follows, where the shift operation is independent of the signs of either of the values being multiplied:

$$\text{sgn}(r) = \text{sgn}(z) \oplus \text{sgn}(\text{val}) \tag{18}$$

$$\text{magnitude}(r) = z \gg \text{val} \tag{19}$$

Two's compliment and sign-magnitude are methods of encoding to allow negative numbers to be represented in binary.

It will be clear to the skilled person how the equations (14a)-(19) will be implemented for a multiplication of value of the format: $2^{val}$, to accommodate a shift left rather than a shift right.

In prior art implementations, 2-level sigma-delta modulators are used to keep multiplications simple; with levels of +1, a multiplication can be implemented by a multiplexer choosing between the coefficient value and its negative. The quantizer 300 described herein means that the digital filter 502 (or further embodiments in accordance with the understanding of the skilled person) do not require the hardware implementation of full multiplier structures because all multiplications reduce down to multiplexers and shift operations. A multiplexer may be used when the quantizer 300 outputs a zero, as multiplication by zero is always zero. This corresponds to a special case that should not be computed with a shifter circuit.

In summary, the quantizer's 300 quantisation levels are encoded in such a way as to simplify the multiplication operations within the digital filter 502, thereby leading to an area efficient hardware implementation.

Figure 6:
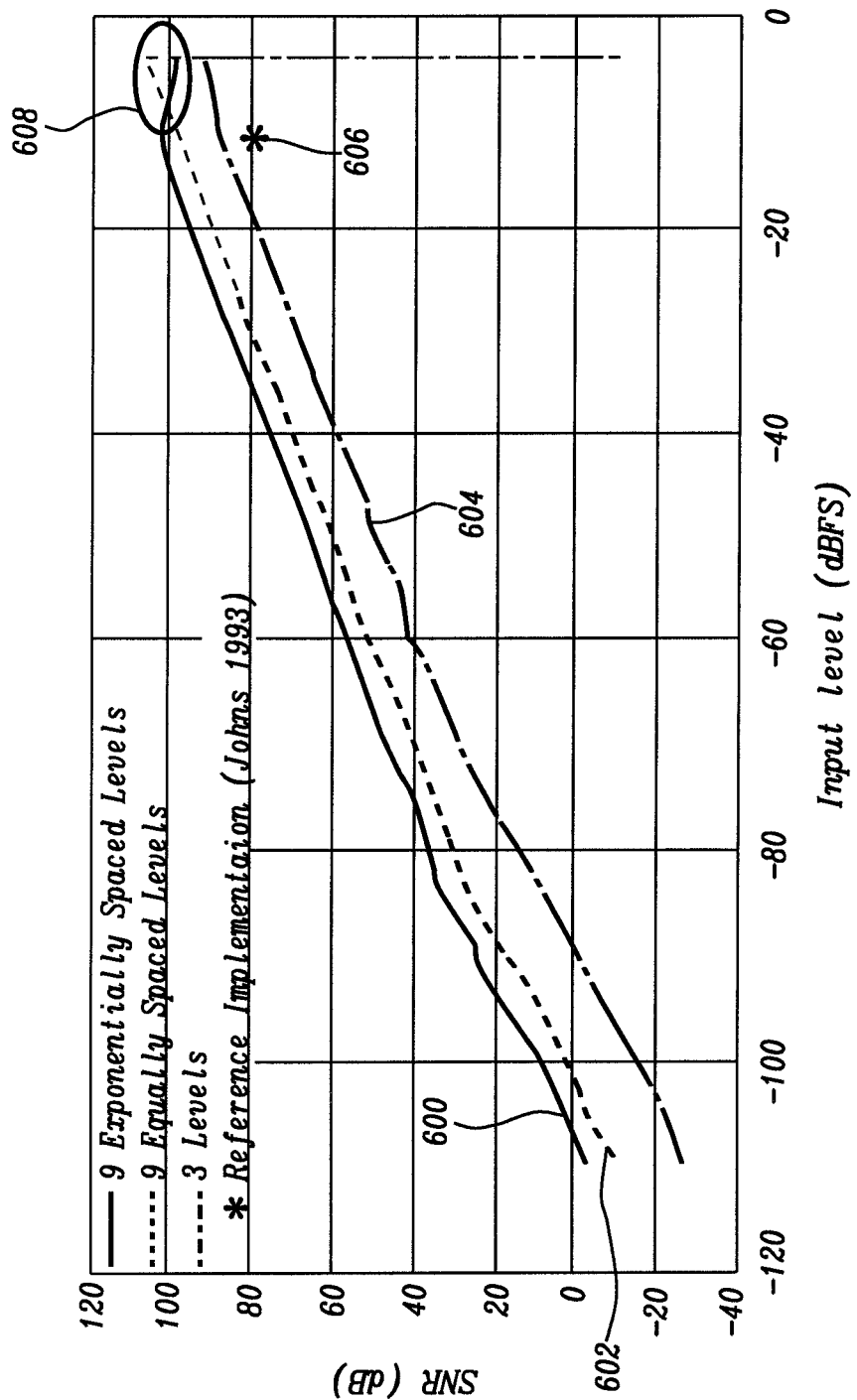
FIG. 6 is a graph showing the signal to noise ration performance of a practical implementation the digital filter of FIG. 5B.

FIG. 6 is a graph showing the SNR performance of a practical implementation the digital filter 502 implementing the sigma-delta modulator 400 (labelled 600), a practical implementation of a digital filter implementing a sigma-delta modulator using a quantizer of the type shown in FIG. 2A and providing uniform quantization level spacing (labelled 602), a practical implementation of a digital filter implementing a sigma-delta modulator having three levels of quantization (labelled 604) and a data point 606 representing the 2-level PDM filter detailed in David A. Johns and David M. Lewis; Design and Analysis of Delta-Sigma Based IIR Filter; IEEE Transactions on Circuits and Systems—II: Analog and Digital Signal Processing, Vol. 40, No. 4; April 1993.

When moving from uniformly spaced levels to non-uniformly spaced levels, there is an increase in the output SNR of the digital filter across almost the whole range of input levels, except for above a crossover point at about −10 dBFS, where the SNR of the non-uniformly spaced level implementation plateaus, as circled and labelled by numeral 608.

This plateauing is caused by the distribution of the non-uniformly spaced levels of the quantizer 300 not allowing more quantization levels to represent higher signal levels despite more levels being allowed by the sigma-delta modulator 400 itself. As such, input signals 302 at this level behave as if being modulated by a system providing fewer quantization levels than the true number being used. The SNR at these levels therefore tends to be worse than the equivalent uniformly spaced quantization level system (labelled 602). This doesn't deteriorate performance because the SNR at these levels plateaus at a high enough level to be acceptable for an acoustic system. This trade-off allows an increase in the system dynamic range, as shown by the shift left of the x-axis crossing compared to the equally spaced quantization levels system using the same number of levels.

In summary, the sigma-delta based filter structures described herein may use of non-uniformly spaced quantization levels to increase the SNR of the filter output whilst maintaining an energy efficient operation and minimising the required area for a hardware implementation, when compared with prior art methods.

FIG. 7A is a schematic of an apparatus 700 in accordance with a fifth embodiment of the present disclosure. The apparatus 700 comprises a microphone 702 for receiving an acoustic signal 704 and configured to the convert the acoustic signal 704 into the input signal 302 in a digital format suitable for digital processing. The apparatus 700 further comprises the digital filter 500, which may be implemented, for example, as the digital filter 502 shown in FIG. 5B. Common reference numerals and variables between Figures represents common features.

FIG. 7B is a schematic of an adaptive noise cancelling (ANC) system 706 comprising the microphone 702 and the digital filter 500 in accordance with a sixth embodiment of the present disclosure. In the present embodiment, the ANC system 706 is a headphone and in a further embodiment, the ANC system 706 may be a set of headphones. The ANC system 706 may comprise a processing block 708 for receiving the quantized signal 304. The quantized signal 304 may be processed by the processing block 708 to generate a suitable audio signal to provide acoustic suppression functionality. Common reference numerals and variables between Figures represents common features.

An ANC system requires a sufficiently low latency to provide a suitably high bandwidth and level of acoustic suppression. To provide a sufficiently low latency, it is necessary that the digital filter operates at the sampling rate of the microphone or higher.

As discussed previously, a quantizer, and therefore digital filter implementing said quantizer and in accordance with the prior art, may have an increased SNR by using an increased oversampling ratio, a higher order sigma-delta modulator or more quantization levels. These methods require further components which result in greater occupation of silicon area. Therefore, to provide a suitable SNR for audio applications with low latency filtering, it would be necessary to compromise on silicon area.

However, the quantizer 300 of this disclosure uses non-uniformly spaced quantization levels to increase the SNR at lower input levels which means that fewer quantization levels are required, and therefore a smaller circuit can be used to achieve the required SNR at all relevant input levels when compared with the uniformly spaced quantization levels of the prior art. By using the specific spacing of the quantization levels described previously, the circuit size may be further reduced.

For an ANC system the digital filter 500, implementing the sigma-delta modulator 400 that implements the quantizer 300, can be run at a high sampling rate, to minimise latency. Additionally, a latency stage associated with a sample-rate converter is not required as PDM microphone inputs may be used directly.

The SDM-based digital filter 500 makes use of a quantization scheme that provides a relatively low quantisation error at low input levels compared to known prior art quantization scheme. Furthermore, the quantization scheme of the present disclosure lends itself to a numerical representation which simplifies the implementation of multiplication operations within the digital filter 500 by enabling multiplication operations to be implemented using shifting operations. This allows the digital filter 500 to operate efficiently, at high speed and, for a physical implementation, with efficient use of circuit area.

Figure 8:
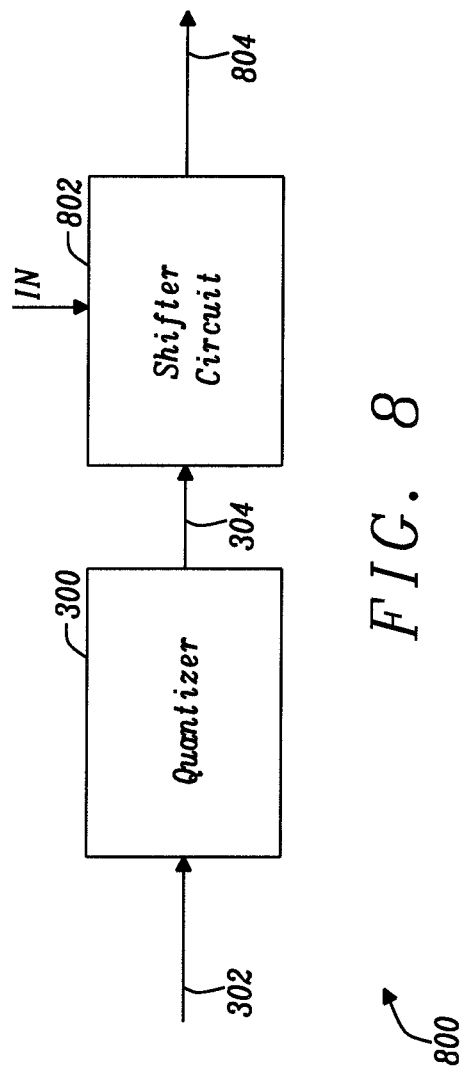
FIG. 8 is a schematic of an apparatus in accordance with a seventh embodiment of the present disclosure.

FIG. 8 is a schematic of an apparatus 800 in accordance with a seventh embodiment of the present disclosure. The apparatus 800 comprises a shifter circuit 802 for providing a bit shifting operation and the quantizer 300, as previously described.

Common features between figures share common reference numerals and variables.

The shifter circuit 802 is configured to receive the quantized signal 304 from the quantizer 300 and to perform one or more bit shifting operations using the quantized signal 304. The shifter circuit 802 may be used to provide the functionality of a multiplication circuit, where a value of the quantization signal 304 can be multiplied by an input variable IN using a bit shift operation, as described previously. The result of the shifting operation may be provided as an output of the shifter circuit 802.

Various improvements and modifications may be made to the above without departing from the scope of the disclosure.

What is claimed is:

1. An apparatus comprising a quantizer configured to:
receive an input signal comprising successive input values;
quantize the input signal at discrete intervals to form a quantized signal by mapping the input value of the input signal at each interval to one of a plurality of quantization levels comprising three or more quantization levels that are non-uniformly spaced; wherein:
the plurality of quantization levels comprises a first portion comprising two or more quantization levels each:
  i) having the same sign; and
  ii) being proportional to a first fraction having one as its numerator and two to a power of a first variable as its denominator, the first variable being an integer and having a different value for each of the two or more quantization levels of the first portion.

2. The apparatus of claim 1, wherein the two or more quantization levels of the first portion are positive quantization levels having a positive sign or the two or more quantization levels of the first portion are negative quantization levels having a negative sign.

3. The apparatus of claim 1, wherein the two or more quantization levels of the first portion successively decrease in absolute value from a first quantization level; wherein:
each successive quantization level of the first portion after the first quantization level is proportional to the first fraction where the first variable increases by a first step value for each successive quantization level; and
the first step value is an integer that is greater than or equal to one.

4. The apparatus of claim 3, wherein the first variable is equal to zero for the first quantization level.

5. The apparatus of claim 1, wherein each quantization level of the first portion is equal to the first fraction or equal to the negative of the first fraction.

6. The apparatus of claim 1, wherein the quantization levels comprise a quantization level that is equal to zero.

7. The apparatus of claim 1, wherein the plurality of quantization levels comprises a second portion comprising two or more quantization levels each:
  i) having the same sign; and
  ii) being proportional to a second fraction having one as its numerator and two to a power of a second variable as its denominator, the second variable being an integer and having a different value for each of the two or more quantization levels of the second portion.

8. The apparatus of claim 7, wherein the two or more quantization levels of the first portion of quantization levels are positive quantization levels having a positive sign and the two or more quantization levels of the second portion of quantization levels are negative quantization levels having a negative sign.

9. The apparatus of claim 8, wherein the negative quantization levels are equal to the negative of the positive quantization levels.

10. The apparatus of claim 1, wherein the input signal comprises two or more levels of quantization.

11. The apparatus of claim 1 comprising a sigma-delta modulator comprising the quantizer.

12. The apparatus of claim 11, wherein the two or more quantization levels of the first portion are positive quantization levels having a positive sign or the two or more quantization levels of the first portion are negative quantization levels having a negative sign.

13. The apparatus of claim 12, wherein the two or more quantization levels of the first portion successively decrease in absolute value from a first quantization level; wherein:
each successive quantization level of the first portion after the first quantization level is proportional to the first fraction where the first variable increases by a first step value for each successive quantization level; and
the first step value is an integer that is greater than or equal to one.

14. The apparatus of claim 13, wherein the first variable is equal to zero for the first quantization level.

15. The apparatus of claim 11, wherein each quantization level of the first portion is equal to the first fraction or equal to a negative of the first portion.

16. The apparatus of claim 11, wherein the sigma-delta modulator is configured to output the quantized signal that is generated by the quantizer.

17. The apparatus of claim 11 comprising a digital filter comprising the sigma-delta modulator.

18. The apparatus of claim 17 comprising:
a microphone for receiving an acoustic signal configured to the convert the acoustic signal into the input signal in a digital format suitable for digital processing.

19. The apparatus of claim 18, wherein the apparatus is implemented within an adaptive noise cancelling system.

20. The apparatus of claim 19, wherein the adaptive noise cancelling system is implemented within a headphone or a set of headphones.

21. The apparatus of claim 1 comprising:
a shifter circuit for providing a bit shifting operation; wherein:

the shifter circuit is configured to receive the quantized signal from the quantizer and to perform one or more bit shifting operations using the quantized signal.

22. A method of quantizing an input signal using a quantizer, the method comprising:

receiving the input signal comprising successive input values;

quantizing the input signal at discrete intervals to form a quantized signal by mapping the input value of the input signal at each interval to one of a plurality of quantization levels comprising three or more quantization levels that are non-uniformly spaced; wherein:

the plurality of quantization levels comprises a first portion comprising two or more quantization levels each:
i) having the same sign; and
ii) being proportional to a first fraction having one as its numerator and two to a power of a first variable as its denominator, the first variable being an integer and having a different value for each of the two or more quantization levels of the first portion.

* * * * *